ative Examiner—Charles L. Bowers, Jr.
United States Patent [19]

Loprest et al.

[11] 4,093,461
[45] June 6, 1978

[54] POSITIVE WORKING THERMALLY STABLE PHOTORESIST COMPOSITION, ARTICLE AND METHOD OF USING

[75] Inventors: Frank J. Loprest, Binghamton, N.Y.; Eugene F. McInerney, Chagrin Falls, Ohio

[73] Assignee: GAF Corporation, Wayne, N.J.

[21] Appl. No.: 597,226

[22] Filed: Jul. 18, 1975

[51] Int. Cl.² .................. G03C 1/54; G03C 1/60; G03C 5/34
[52] U.S. Cl. ............................ 96/36; 96/35.1; 96/36.2; 96/49; 96/75; 96/91 D; 96/115 R
[58] Field of Search ................. 96/91 D, 115 R, 35.1, 96/36, 36.2, 33, 49; 156/13; 428/458

[56] References Cited

U.S. PATENT DOCUMENTS

| | | | |
|---|---|---|---|
| 3,050,389 | 8/1962 | Sus | 96/33 |
| 3,126,281 | 3/1964 | Sus et al. | 96/91 D |
| 3,179,634 | 4/1965 | Edwards | 428/458 |
| 3,495,979 | 2/1970 | Laridon et al. | 96/91 D |
| 3,551,154 | 12/1970 | DiBlas et al. | 96/91 D |
| 3,623,870 | 11/1971 | Curran et al. | 96/75 |
| 3,637,384 | 1/1972 | Deutsch et al. | 96/91 D |
| 3,712,814 | 1/1973 | Von Rintelen et al. | 96/36 |
| 3,732,105 | 5/1973 | Klupfel et al. | 96/115 R |
| 3,759,711 | 9/1973 | Rauner et al. | 96/91 D |
| 3,802,885 | 4/1974 | Lawson et al. | 96/91 D |
| 3,833,436 | 9/1974 | Hillis et al. | 96/36 |
| 3,871,930 | 3/1975 | Fish | 96/36.2 |

OTHER PUBLICATIONS

Kosar, J., "Light–Sensitive Systems," J. Wiley & Sons, 1965, pp. 336–342 and 356.

*Primary Examiner*—Charles L. Bowers, Jr.
*Attorney, Agent, or Firm*—Walter C. Kehm; Edward G. Comrie

[57] ABSTRACT

A positive working, thermally stable photoresist, comprising a light-sensitive orthoquinone diazide or naphthoquinone diazide and a polyamic acid condensation product of an aromatic dianhydride and an aromatic di-primary amine, and a support carrying a layer of said photoresist. After exposure, the image is developed in the layer with an alkaline aqueous developer and is unaffected by heating to 500° C, thus allowing the use of the photoresist layer for plasma and sputter-etching as well as ion implantation.

23 Claims, No Drawings

POSITIVE WORKING THERMALLY STABLE PHOTORESIST COMPOSITION, ARTICLE AND METHOD OF USING

The present invention relates to photoresists, and more particularly to a positive-working, thermally stable photoresist. Thermal stability in this context means not only that the resist does not decompose at a given temperature but that images in the resist undergo little or no dimensional changes or distortion at the given temperature.

Modern technology for processing semiconductors, such as plasma and sputter etching, ion beam implantation, and the like, require photoresists having stability at high temperatures, such as about 300° C and higher. Conventional photoresists are available with thermal stability at about 160° C, and while they are useful at temperatures up to 160° C, their thermal stability above 160° C is not sufficient for use in the high temperature processes described above.

A negative-working photoresist is disclosed in U.S. Pat. No. 3,623,870, which is stated to have improved thermal properties. Negative-working resists are in widespread use, but nevertheless positive-working resists have inherent advantages over negative-working resists, as is well known. A positive-working, thermally stable photoresist would be highly advantageous and much prized by the workers in the art.

It is thus an object of the invention to provide a thermally stable, positive-working photoresist that can be used at elevated temperatures for processing semiconductors.

The present invention fulfills this objective by providing a thermally stable photoresist composition, which comprises a light-sensitive orthoquinone diazide or orthonaphthoquinone diazide and a polyamic acid condensation product of an aromatic dianhydride and an aromatic di-primary amine.

An improved thermally stable, supported positive-working photoresist is also provided by the invention, which comprises a base material having coated thereon the photoresist composition of the invention.

The orthoquinone diazides and orthonaphthoquinone diazides used are known light-sensitive compounds that are water-insoluble, hydrophobic, and organic solvent soluble. Upon exposure to light, the compounds are converted into derivatives that are soluble in an aqueous alkaline solution. The polyamic acid reaction product used as the binder is also organic solvent soluble and is soluble in aqueous alkaline solution. Thus, the photoresist composition of the invention is coated on a support as a solution in an organic solvent, and the imagewise exposed photoresist is developed with an alkaline aqueous solution. Light-struck areas contain a mixture of polyamic acid resin and the reaction product of the orthoquinone diazide that is soluble in the aqueous alkaline developer, so that the mixture can be removed from the support during treatment with the alkaline aqueous developer. Areas that are not light-struck contain a mixture of polyamic acid resin and the diazide that is insoluble in the aqueous alkaline developing solution because of the hydrophobicity and insolubility of the diazide before photolysis. Hence a positive image is formed on the support corresponding to the master pattern used during imagewise exposure.

The present invention is based on the use of a positive-working photoresist that can be coated on a support from an organic solvent and developed by an aqueous alkaline solution. By the use of such different solvations, the present invention is able sharply to distinguish between imagewise exposed and non-exposed areas during development and thus ensure that only light-struck areas are dissolved by solvation by the developer whereas imagewise non-exposed areas are unaffected by the developer. In U.S. Pat. No. 3,623,870 a negative-working photoresist is disclosed having a light-sensitive dichromate and a polyamic acid binder. The dichromate in the light-struck areas cross-links the polyamic acid binder to form a product that is less soluble in the developer than the uncross-linked polyamic acid. Thus, development proceeds via different rates of solubility between imagewise exposed and non-exposed areas, not via different solvations. As a result, it is difficult, if at all possible, in the prior system to prevent some attack by the developer solvent on the imagewise non-exposed areas, which is not desired.

Light-sensitive orthoquinone diazides and orthonaphthoquinone diazides are known in the art. See, e.g. U.S. Pats. No. 2,772,972, 2,797,213 and 3,669,658 and "Light Sensitive Systems", Jaromir Kosar, John Wiley & Sons, Inc., New York (1965), pages 336–352. Particularly useful diazides are those that are insoluble in aqueous alkaline solution and that provide light-decomposition products that are very soluble in the aqueous alkaline developer. Diazides having an abietyl substituent are particularly useful because of their pronounced hydrophobic properties and resistance to crystallization from the coating. Among the preferred diazides are:

N-dehydroabietyl-6(5H)-diazo-5(6H)-oxo-1-naphthalene sulfonamide,

N-dehydroabietyl-3-diazo-4-oxo-1,5-cyclohexadiene-1 sulfonamide,

N-dehydroabietyl-3-diazo-4(3H)-oxo-1-naphthalene sulfonamide,

N,N'-didehydroabietyl-3-diazo-4(3H)-oxo-1,6-naphthalene sulfonamide,

N-dehydroabietyl-N-2-hydroxyethyl-6-diazo-5(6H)-oxo-1-naphthalene sulfonamide,

N-dehydroabietyl-3-diazo-6-methyl-4-oxo-1,5-cyclohexadiene-1 sulfonamide,

N-dehydroabietyl-5,6,7,8-tetrahydro-4-diazo-3(4H)-oxo-2-naphthalene sulfonamide, N-dextropimaryl-3-diazo-4-oxo-1,5-cyclohexadiene-1 sulfonamide, N-dehydroabietyl-N-ethyl-6-diazo-5(6H)-oxo-1-naphthalene sulfonamide, N-dihydroabietyl-6-diazo-5(6H)-oxo-1-naphthalene sulfonamide, N-tetrahydroabietyl-6-diazo-5(6H)-oxo-1-naphthalene sulfonamide.

As is known, the polyamic acid condensation product of an aromatic dianhydride and an aromatic di-primary amine is readily formed. A particularly suitable aromatic dianhydride is pyromellitic dianhydride. Suitable aromatic diamines are aromatic di-primary amines of the benzene or naphthalene series, including di-primary amino phenyl ethers. Such polyamic acid condensation products are known, e.g. in U.S. Pat. No. 3,179,634, and are readily converted by heat to a thermally stable polyimide that is water-insoluble, resistant to dilute acids and organic solvents and heat stable at temperatures in excess of 400° C.

The photoresist composition of the invention is prepared by mixing the diazide with the polyamic acid condensation product in an organic solvent, such as 1-methyl-2-pyrrolidone, dimethylformamide, dimethylacetamide, and the like. Generally, the weight ratio of polyamic acid to diazide will be from about 1:20 to about 10:1, preferably from about 1:10 to about 5:1. The polyamic acid is prepared in an organic solvent, such as a solution containing from about 10 to about 20% polyamic acid, and conveniently the diazide is added to this solution. The quantity of solvent and its volatility are selected to obtain the specific thickness and coating quality desired in accordance with known coating techniques.

The solution of diazide and polyamic acid in the organic solvent is coated on a suitable support by any customary procedure, as by spin coating, dipping, brushing, rolling, spraying and the like. The particular technique employed depends on the consistency, viscosity and solids content of the solution. Spin coating at 2000 to 10000 rpm for 1 to 90 seconds has been found to be acceptable and results in a uniform photoresist layer. The thickness of the photoresist layer on the support may range from about 0.3 to about 100 microns. When the thicker coatings are used, the time required for exposure and for developing the plate increases. For most uses, a thickness of from about 0.3 to about 8 microns, preferably 0.8 to about 4 microns, will give satisfactory results. For printed circuits, higher thicknesses are required, generally ranging from about 15 to about 100 microns, preferably from about 25 to about 50 microns. For any given method of applying the coating, it is desirable to use as high a solids content in the coating composition as possible.

After the coating is applied to the support, it is permitted to dry. The support can be maintained at room temperature so as to permit evaporation of the solvent; preferably it is put in an oven at a temperature of about 80° C to accelerate the evaporation of the solvent.

Any suitable support may be used for the photoresist, such as those employed in the microelectronic and printed circuit industry. Such supports include glass, metallic plates, bi-mettalic and tri-metallic plates, semiconductor wafers, finished printed circuits and the like.

The photoresist of the invention may be imagewise exposed through a positive or negative mask, customarily a negative mask, by a suitable actinic light source, such as a 200-watt medium or high pressure mercury arc lamp. The exposure time and incident industry will be determined empirically to obtain optimum results with a given mask and photoresist, but generally an exposure of about 30 to about 60 seconds with an incident intensity of from 3000 to 4600 microwatts/cm$^2$ will give satisfactory results.

After exposure, the photoresist is developed in an alkaline aqueous solution of an organic or inorganic base, such as an organic amine. Preferably, the alkaline aqueous developer contains a small quantity of a surfactant to lower the surface tension thereof. In general, the developer may contain from about 0.01 to about 25 percent of the base and from about 0.1 to about 0.5 percent of the surfactant, when used. Dialkyl- and dialkanolamines, such as diethylethanolamine, diethylamine, diethanolamine, triethanolamine, etc., cyclic amines, such as piperidine and the like, alkali metal salts of strong and weak acids, such as sodium hydroxide, sodium carbonate, sodium dihydrogen phosphate and the like, are quite suitable as the base. Useful surfactants include an alkyl aryl sulfonate or an ethylene oxide adduct of a long chain alcohol or the like.

Development time will be determined empirically, as is customary, but usually development can be completed in about 5 to 60 seconds. Room temperature (about 20° C) is entirely suitable, but elevated temperatures can be used, if desired.

The photoresist thus formed has excellent resistance to acid etches, and where it is to be used with acid etches at a temperature below about 200° C, the developed plate can be used as is.

Where the developed plate is to be used with a basic etch, regardless of the temperature, the plate is given an overall exposure to actinic light to decompose the diazide remaining on the plate, such as for 60 to 180 seconds at about 3000 microwatts/cm$^2$, and the polyamic acid condensation product is converted to the polyimide form by heating the photoresist for about 30 minutes at 220° or higher. The polyimide form will withstand the basic etches.

Where the photoresist is to be used at temperatures of about 200° C and higher, with acid or basic etches, the plate is preferably given the overall exposure described above, to avoid any possibility of image distortion resulting from nitrogen gas released by thermal decomposition of the diazide at the processing temperature. The overall exposure step may be omitted if the photoresist is heated slowly during use to avoid rapid decomposition of the diazide. When the photoresist is used at temperatures of about 200° C and higher, the conversion to the polyimide occurs during use. If desired, the polyamic acid condensation product may be converted to the polyimide form before use in order to insure thermal stability of the image during use of the photoresist at the elevated temperatures of about 200° C and higher.

The photoresist can be used in any semi-conductor processing technique without thermal distortion. When desired, the photoresist layer can be cleanly stripped from the support by treatment with a strong acid, such as sulfuric acid, at elevated temperature, such as 140° to 180° C, for a few minutes.

The present invention is illustrated by the following Examples. All parts and proportions as referred to herein and in the appended claims are by weight unless otherwise noted.

EXAMPLE 1

A photoresist composition was prepared by admixing:
83.50g of Polyamic acid condensation product of pyromellitic dianhydride and 4,4'-di-primary aminodiphenylether (17% solids in N-methyl pyrrolidone)
16.50g of N-dehydroabietyl-6(5H)-diazo-5(6H)-oxo-1-naphthalene sulfonamide
100 ml of Dimethylformamide Several photoresists were prepared by spin coating the resulting admixture for 60 seconds on a glass support at the speeds noted in Table I to obtain coatings of different thicknesses. To improve adhesion of the photoresist coating to the glass support, a precoat of hexamethyldisilazane was used, but other silazanes can be used, as is customary. The solvent was removed after spin coating by heating the plates at 80° C for one hour.

Table I

| Spin speed vs Thickness | |
|---|---|
| Spin Speed × 1000 (RPM) | Thickness (Microns) |
| 2.0 | 1.37 |
| 2.5 | 1.17 |

Table I-continued

Spin speed vs Thickness

| Spin Speed × 1000 (RPM) | Thickness (Microns) |
|---|---|
| 4.0 | 0.98 |
| 6.0 | 0.79 |
| 8.0 | 0.71 |
| 10.0 | 0.66 |

EXAMPLE 2

Following the procedure of Example 1, photoresists were prepared having a coating of 1.2μ of the photoresist composition on glass plates. The photoresists were then given a UV exposure through a split field high resolution test mask with a 200 watt medium pressure mercury arc source. The incident intensity was of the order of 3,000 microwatts/cm² and an exposure time of 60 seconds was found to be adequate.

After exposure, development was effected by immersing the photoresists for about 20 seconds at about 25° C in a developer consisting of a 10% aqueous solution of diethylethanolamine diluted with water on a 1:15 v/v basis. Adequate development also resulted by immersion of the plates for 15 seconds at about 21° C in a 10% aqueous diethylethanolamine solution diluted with water on a 1:30 v/v basis.

Following development, the photoresist plates were given an overall UV exposure using the same lamp and incident intensity as in the imaging exposure for exposure times of 60 and 120 seconds in order to photodecompose the quinone diazide.

To determine the effect of heat on image resolution, the plates thus prepared were heated at 300° C for 1 hour, and no image distortion was noted even at the 1 micron geometry.

EXAMPLE 3

This Example shows that the photoresist herein disclosed is particularly useful for the etching of aluminum layers, which requires vigorous acidic etching solutions employed at elevated temperature, about 60° C, to shorten the time expended in etching. Many commercial positive resists cannot withstand the combination of highly active acid etches and high temperature, whereas the present resist can while providing good resolution and fidelity of etched images.

A glass plate coated by vapor phase deposition with 10,000Å of pure aluminum was coated with the photoresist composition of Example 1 by spinning at 2500 rpm for 60 seconds to yield a thickness of 1.0μ. The plate was then baked (prebake) at 80° C. After cooling, the plate was exposed in contact with a high resolution mask with both dark field and clear field features, the smallest of which were 1.25μ, by means of a UV light source of intensity of 3000μ watts/cm² for 60 seconds. The exposed plate was then developed by immersion in 0.5% aqueous solution of diethylethanolamine for 15 seconds at 22° C followed by rinsing in deionized water. The plate was then given an overall (non-imagewise) exposure for 60 seconds using the same UV light source, and then post-baked for 15 minutes at 200° C. After allowing the plate to cool, it was immersed in the following etch solution for 2 minutes at 60° C:

| Concentrated phosphoric acid ($H_3PO_4$) | = | 800 ml |
|---|---|---|
| Concentrated nitric acid ($HNO_3$) | = | 50 ml |
| Concentrated acetic acid ($HC_2H_3O_2$) | = | 50 ml |
| Deionized water ($H_2O$) | = | 100 ml |
| Total | | 1000 ml |

After rinsing, the images examined under the microscope showed good resolution and fidelity to mask dimensions.

What is claimed is:

1. A positive working photoresist composition, comprising a mixture of a light-sensitive orthoquinone diazide or ortho naphthoquinone diazide and a polyamic acid condensation product of an aromatic dianhydride and an aromatic di-primary amine.

2. The photoresist composition according to claim 1, wherein said polyamic acid condensation product is the condensation product of pyromellitic dianhydride and 4,4′-amino-diphenylether.

3. The photoresist composition according to claim 1, wherein the weight ratio of polyamic acid to diazide is from about 1:20 to about 10:1.

4. The photoresist composition according to claim 1, wherein said diazide is N-dehydroabietyl-6(5H)-diazo-5(6H)-oxo-1-naphthalene sulfonamide.

5. The photoresist composition according to claim 1, wherein said diazide and said polyamic acid are solution an organic solvent.

6. A photosensitive material, comprising a mixture of a support having coated thereon a layer comprising a light-sensitive orthoquinone diazide or orthonaphthoquinone diazide and a polyamic acid condensation product of an aromatic dianhydride and an aromatic di-primary amine.

7. The article according to claim 6, wherein said polyamic acid condensation product is the condensation product of pyromellitic dianhydride and 4,4′-amino-diphenylether.

8. The article according to claim 6, wherein the weight ratio of polyamic acid to diazide is from about 1:20 to about 10:1.

9. The article according to claim 6, wherein said diazide is N-dehydroabietyl-6(5H)-diazo-5(6H)-oxo-1-naphthalene sulfonamide.

10. The article according to claim 6, wherein said support is glass.

11. The article according to claim 6, wherein said support is a metallic plate.

12. The article according to claim 6, wherein said support is a semiconductor wafer.

13. A method of forming a thermally stable positive photoresist image, which comprises imagewise exposing to actinic light the photosensitive material according to claim 6, and developing a positive relief image by treating the exposed layer with an alkaline aqueous developer thereby removing the imagewise exposed areas.

14. The method according to claim 13, wherein the layer is heated after development to a temperature of at least about 200° C to convert the polyamic acid condensation product in the developed image to the polyimide form.

15. The method according to claim 14, wherein the layer is given an overall exposure to actinic light after development and before heating to decompose diazide in the developed image.

16. The method according to claim 13, wherein the developer is an alkaline aqueous solution of an organic base.

17. The method according to claim 16, wherein the organic base is diethylethanolamine.

18. The method according to claim 13, wherein said polyamic acid condensation product is the condensation product of pyromellitic dianhydride and 4,4'-aminodiphenylether.

19. The method according to claim 13, wherein the weight ratio of polyamic acid to diazide is from about 1:20 to about 10:1.

20. The method according to claim 13, wherein said diazide is N-dehydroabietyl-6(5H)-diazo-5(6H)-oxo-1-naphthalene sulfonamide.

21. The method according to claim 13, wherein said support is glass.

22. The method according to claim 13, wherein said support is a metallic plate.

23. The method according to claim 13, wherein said support is a semiconductor wafer.

* * * * *